(12) United States Patent
Kuan et al.

(10) Patent No.: US 10,115,563 B2
(45) Date of Patent: Oct. 30, 2018

(54) ELECTRON-BEAM LITHOGRAPHY METHOD AND SYSTEM

(71) Applicant: NATIONAL TAIWAN UNIVERSITY, Taipei (TW)

(72) Inventors: Chieh-Hsiung Kuan, Taipei (TW); Chun Nien, Taipei (TW); Wen-Sheng Su, Taipei (TW); Li-Cheng Chang, Taipei (TW); Cheng-Huan Chung, Taipei (TW); Wei-Cheng Rao, Taipei (TW); Hsiu-Yun Yeh, Taipei (TW); Shao-Wen Chang, Taipei (TW); Kuan-Yuan Shen, Taipei (TW); Susumu Ono, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/610,644

(22) Filed: Jun. 1, 2017

(65) Prior Publication Data

US 2018/0149980 A1     May 31, 2018

(30) Foreign Application Priority Data

Nov. 30, 2016   (TW) .............................. 105139545 A (51) Int. Cl.
  *H01J 37/30*  (2006.01)
  *H01J 37/317* (2006.01)
  *H01J 37/302* (2006.01)

(52) U.S. Cl.
  CPC ...... *H01J 37/3174* (2013.01); *H01J 37/3002* (2013.01); *H01J 37/3026* (2013.01);
  (Continued)

(58) Field of Classification Search
  None
  See application file for complete search history.

(56) References Cited

U.S. PATENT DOCUMENTS 4,520,269 A    5/1985 Jones
5,736,281 A    4/1998 Watson
(Continued)

FOREIGN PATENT DOCUMENTS

CN    104483812 A    4/2015
TW       525226 B    3/2003
(Continued)

OTHER PUBLICATIONS

Hu et al., "Sub-10 nm electron beam lithography using cold development of poly(methylmethacrylate)" Journal of Vacuum Science & technology, 2004.*
(Continued)

*Primary Examiner* — Michael J Logie
(74) *Attorney, Agent, or Firm* — CKC & Partners Co., Ltd.

(57) ABSTRACT

An electron-beam lithography method includes, computing and outputting a development time of a positive-tone electron-sensitive layer and a parameter recipe of an electron-beam device by using a pattern dimension simulation system, performing a low-temperature treatment to chill a developer solution, utilizing an electron-beam to irradiate an exposure region of the positive-tone electron-sensitive layer based on the parameter recipe, and utilizing the chilled developer solution to develop a development region of the positive-tone electron-sensitive layer based on the development time. The development region is present within the exposure region, and an area of the exposure region is smaller than that of the first portion. As a result, the electron-beam lithography method may control a dimension of a development pattern of the positive-tone electron-sensitive layer more accurately, and may also shrink a minimum dimension of the development pattern of the positive-tone electron-sensitive layer.

9 Claims, 6 Drawing Sheets

(52) U.S. Cl.
CPC ............... *H01J 2237/2001* (2013.01); *H01J 2237/31754* (2013.01)

(56) References Cited

U.S. PATENT DOCUMENTS

| | | |
|---|---|---|
| 6,720,565 B2 | 4/2004 | Innes et al. |
| 2013/0017375 A1 | 1/2013 | Ihara et al. |

FOREIGN PATENT DOCUMENTS

| | | |
|---|---|---|
| TW | 201202871 A1 | 1/2012 |
| TW | 201439667 A | 10/2014 |

OTHER PUBLICATIONS

Mohammad et al., "Fundamentals of Electron Beam Exposure and Development", 2012.*
Cord et al., "Optimal temperature for development of poly(methylmethacrylate" 2007.*
Henderson et al., "Cold development of PMMA" 2014.*

* cited by examiner

ELECTRON-BEAM LITHOGRAPHY METHOD AND SYSTEM

RELATED APPLICATIONS

This application claims priority to Taiwan Application Serial Number 105139545, filed Nov. 30, 2016, which is herein incorporated by reference.

BACKGROUND

Technical Field

The present disclosure relates to an electron-beam lithography method and an electron-beam lithography system. More particularly, the present disclosure relates to the electron-beam lithography method and system which can control a dimension of a development pattern more accurately.

Description of Related Art

In recent years, with the increasing development of semiconductor integrated circuit (IC) industry, technological advances in IC materials and design have produced generations of ICs where each generation has smaller and more complex circuits than its previous generation. In general, the semiconductor IC utilizes an optical lithography to form an exposure pattern. However, the optical lithography has an optical diffraction limit, and thus the optical lithography is difficult to improve a size and a resolution of the exposure pattern. Furthermore, the optical lithography needs to use different masks for different exposure patterns, thus causing an increase of unexpected manufacture cost.

Accordingly, how to further improve the size and resolution of the exposure pattern for fabricating smaller and more complex semiconductor ICs becomes one of important research and development issues, and there is an urgent need to be improved in the related fields. In addition, an electron-beam lithography attracts much attention, since it does not require the masks and directly utilizes a focused electron-beam writing without an optical diffraction limit.

SUMMARY

The disclosure relates to an electron-beam lithography method and an electron-beam lithography system which can effectively control the proximity effect of an electron-beam, so as to effectively control the size and resolution of a development pattern.

In accordance with some embodiments of the present disclosure, an electron-beam lithography method includes following steps. A low-temperature treatment is performed to chill a developer solution. Utilize an electron-beam to irradiate an exposure region of a positive-tone electron-sensitive layer. Utilize the chilled developer solution to develop a development region of the positive-tone electron-sensitive layer, in which the development region is present within the exposure region, and an area of the development region is smaller than an area of the exposure region.

In accordance with some embodiments of the present disclosure, an electron-beam lithography system includes an electron-beam device, a developer device, a cooling device and a controller. The electron-beam device is configured to irradiate an exposure region of a positive-tone electron-sensitive layer. The developer device is configured to accommodate a developer solution, in which the developer solution is configured to develop a development region of the positive-tone electron-sensitive layer irradiated by the electron-beam device. The development region is present within the exposure region, and an area of the development region is smaller than an area of the exposure region. The cooling device is mounted in the developer device. The controller is communicatively coupled to the cooling device, and the controller is configured to drive the cooling device chilling the developer solution before the developer device develops the positive-tone electron-sensitive layer.

In the foregoing embodiments, by such configurations of the cooling device and the controller, the electron-beam lithography system may reduce the temperature of the developer solution, so as to control a dissolution rate of the developer solution to dissolve the positive-tone electron-sensitive layer, benefiting to accurately control the size of the development pattern formed in the positive-tone electron-sensitive layer, and also to effectively reduce a minimum size of the development pattern formed in the positive-tone electron-sensitive layer.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, operations, operations, elements, and/or components, but do not preclude the presence or addition of one or more other features, regions, integers, operations, operations, elements, components, and/or groups thereof.

Generally, in an electron-beam process, an electron-sensitive layer is coated on a substrate. When an electron-beam irradiates the electron-sensitive layer, an irradiation region on the electron-sensitive layer is defined as an exposure region of the electron-sensitive layer. However, when the electron-beam propagates into the electron-sensitive layer, an interaction among electrons may cause the electron-beam to generate a forward scattering exposure, that is, a portion of the electrons of the electron-beam may be deflected by a small angle, so as to enlarge the exposure region of the electron-sensitive layer. In addition, when the electron-beam arrives at the substrate, a portion of electrons of the electron-beam may collide with the substrate, such that another portion of the electrons of the electron-beam may be scattered by a wide angle resulting in a backward scattering exposure, so as to enlarge the exposure region of the electron-sensitive layer. In other words, the forward scattering exposure and the backward scattering exposure of the electron-beam may cause the electron-beam to have a proximity effect on the electron-sensitive layer. In other words, the electron beam may generate superposition of exposure energy on a portion of the electron-sensitive layer, thus resulting in a size of the predetermined pattern different from that of the actual pattern. For example, the size of the actual pattern may be larger than a minimum size of the predetermined pattern. Furthermore, when the size of the predetermined pattern is smaller (for example, a minimum line width is smaller), the proximity effect of the electron beam becomes more conspicuous, thus limiting the minimum size and the resolution of the development pattern.

As a result, the present disclosure provides an electron-beam lithography method and an electron-beam lithography system which can effectively control a proximity effect of an electron-beam, thereby enabling the size of the actual pattern can be close to that of the predetermined pattern, also improving the minimum size and the resolution of the development pattern.

Figure 1:
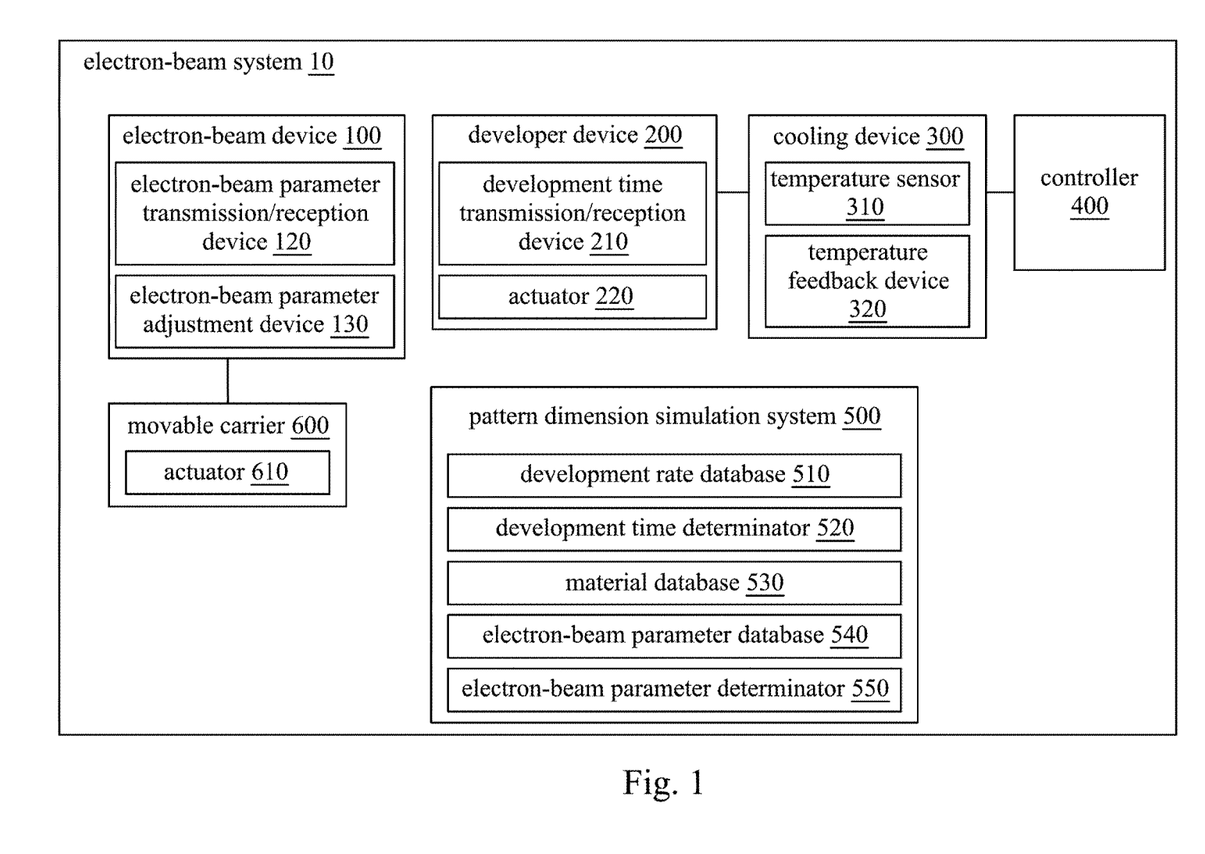
FIG. 1 is a schematic diagram of an electron-beam lithography system in accordance with some embodiments of the present disclosure.
Figure 2:
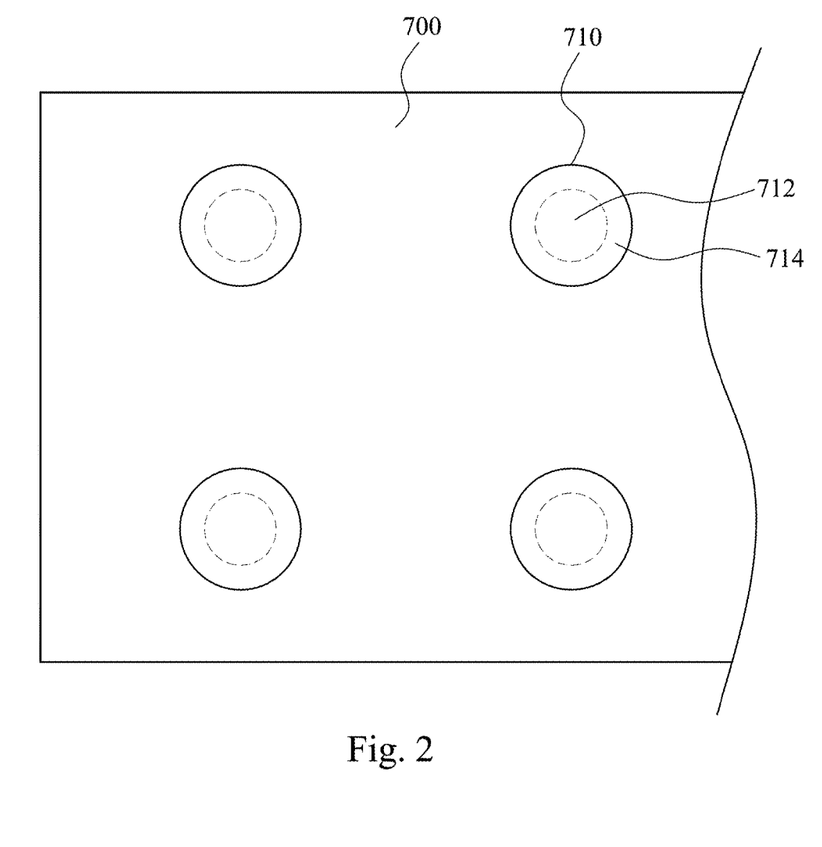
FIG. 2 is a schematic diagram of an electron-beam device for irradiating a positive-tone electron-sensitive layer in accordance with some embodiments of the present disclosure.

Reference is made to FIG. 1 and FIG. 2. FIG. 1 is a schematic diagram of an electron-beam lithography system in accordance with some embodiments of the present disclosure. FIG. 2 is a schematic diagram of an electron-beam device for irradiating a positive-tone electron-sensitive layer in accordance with some embodiments of the present disclosure. In some embodiments, an electron-beam system 10 includes an electron-beam device 100, a developer device 200, a cooling device 300 and a controller 400. The electron-beam 100 is configured to irradiate a first portion 710 (that is, the exposure region) of a positive-tone electron-sensitive layer 700, in which the first portion 710 of the positive-tone electron-sensitive layer 700 has a central part 712 and a peripheral part 714 around the central part 712. The developer device 200 is configured to accommodate a developer solution, and the developer solution is configured to develop the central part 712 (that is, the development region) of the first potion 710 of the positive-tone electron-sensitive layer 700 irradiated by the electron-beam device 100. An area of the central part 712 is smaller than an area of the first portion 710, and the central part 712 is present within the first portion 710. In other words, the developer device 200 is controlled to develop the central part 712 of the positive-tone electron-sensitive layer 700, and controlled to not to develop the peripheral part 714 of the positive-tone electron-sensitive layer 700. The cooling device 300 is mounted in the developer device 200. The controller 400 is communicatively coupled to the cooling device 300 and drives the cooling device 300 cooling the developer solution before the developer device 300 develops the positive-tone electron-sensitive layer. In other words, the positive-tone electron-sensitive layer exposed by the electron-beam 100 is immersed in the chilled developer solution, and the development process is performed at a relatively low temperature. That is, the developer solution may react with the positive-tone electron-sensitive layer at the positive-tone electron-sensitive layer to dissolute at least one portion of the positive-tone electron-sensitive layer, thereby forming the development pattern on the positive-tone electron-sensitive layer. It is noted that, the term "relatively low temperature" used herein indicates that the temperature is lower than that of a developer solution which is not performed a cooling process. The temperature of the developer solution affects the chemical reaction between the developer solution and the positive-tone electron-sensitive layer. Therefore, by using the cooling device 300 and the controller 400, the electron-beam lithography system 10 may reduce the temperature of the developer solution to control a dissolution rate of the developer solution for dissolving the positive-tone electron-sensitive layer, thus advantageously accurately controlling the size of the development pattern formed on the positive-tone electron-sensitive layer, also effectively reducing a minimum size of the development pattern formed on the positive-tone electron-sensitive layer.

It is understood that, based on molecular dynamics, the temperature of the developer solution may affect the extent of the chemical reaction between the developer solution and at least one portion of the positive-tone electron-sensitive layer. In other words, the temperature of the developer solution may vary the dissolution rate of the developer solution for dissolving the positive-tone electron-sensitive layer. In some embodiments, for example, the lower the temperature of the developer solution is, the lower the chemical reactivity between the developer solution and the positive-tone electron-selective layer may be, thereby decreasing the dissolution rate of the developer solution for dissolving the positive-tone electron-sensitive layer may be slower. On the contrary, the higher the temperature of the developer is, the higher the chemical reactivity between the developer solution and the positive-tone electron-selective layer may be, thereby increasing the dissolution rate of the developer solution for dissolving the positive-tone electron-sensitive layer. As a result, by decreasing the temperature of the developer solution, the electron-beam lithography system 10 may reduce a development rate of the positive-tone electron-sensitive layer irradiated by the electron-beam, so as to increase a tolerance of the development time towards the size of the predetermined pattern. For example, when the size of the development pattern is small, the development time can be easily controlled to adjust the size of the development patter by utilizing the developer solution with the relatively low temperature to develop the positive-tone electron-sensitive layer. On the contrary, when the development rate is too fast, the difference between the development times for different sizes of the development patterns would be too small to be controlled. In some embodiments, for example, at a condition of high development rate, the difference between the development times for 6 nm and 8 nm development patterns may be just a few milliseconds, and is difficult to be accurately controlled. Therefore, by decreasing the temperature of the developer solution, the electron-beam lithography system 10 is advantageous to form the small size of the development pattern on the positive-tone electron-sensitive layer.

In some embodiments, the controller 400 is configured to drive the cooling device 300 to chill the developer solution at a temperature ranging from about −25° C. to about 40° C., so as to effectively reduce the dissolution rate of the developer solution. More particularly, when the developer solution is received in the cooling device 200, the controller 400 may control a temperature variation per unit time, and a duration time of the cooling process, such that the temperature of the developer solution may reach a predetermined temperature and steadily maintain at the predetermined temperature for the duration time. In some embodiments, for example, the duration time of the cooling process of the cooling device 300 may be, but is not limited to, about 12 hours to about 18 hours, about 18 hours to about 24 hours, about 24 hours to about 30 hours, or about 30 hours to about 36 hours, such that the developer solution may steadily maintain at the predetermined temperature. In some embodiments, the predetermined temperature of the developer solution may be, but is not limited to, about −25° C. to about −20° C., about −20° C. to about −15° C., about −15° C. to about −10° C., about −10° C. to about −5° C., about −5° C. to about 0° C., about 0° C. to about 5° C., about 5° C. to about 10° C., about 10° C. to about 15° C., about 15° C. to about 20° C., about 20° C. to about 25° C., about 25° C. to about 30° C., about 30° C. to about 35° C., about 35° C. to about 40° C. It is noted that, when the temperature of the developer solution is less than −25° C., the developer solution may be solidified, such that the developer solution may not dissolve the positive-tone electron-sensitive layer. When the temperature of the developer solution is greater than 40° C., the developer solution may have a fast dissolution rate for dissolving the positive-tone electron-sensitive layer, and thus the size of the development pattern formed in the positive-tone electron-sensitive may not be accurately controlled. Accordingly, the temperature of the developer solution is between about −25 and 40° C., or between the −25° C. and 20° C. Furthermore, different developer solutions may have different temperature ranges as long as the development rate may effectively be reduced without solidifying the developer solution.

In some embodiments, for example, the developer device 200 may be a chemical tank, or another suitable device. In some embodiments, the cooling device 300 may include, but is not limited to, a compressor, a condenser, a cooler, a fan motor, and other suitable devices. In some embodiments, the cooling device 300 may further include a temperature sensor 310 and a temperature feedback device 320. The temperature sensor 310 is configured to measure the actual temperature of the developer solution in the developer device 200, and the temperature feedback device 320 is configured to provide a signal of the actual temperature to the controller 400. Afterwards, the controller 400 may adjust or control the cooling device 300 based on a difference between the actual temperature and the predetermined temperature, such that the cooling device 300 may control the developer solution at the predetermined temperature, but it is not limited thereto.

In general, by analyzing and controlling the development rate, the electron-beam lithography system 10 of the present disclosure may accurately control the size of the development pattern of the positive-tone electron-sensitive layer. For understanding the present disclosure, a relationship between the energy received by the positive-tone electron-sensitive layer and the development rate of the positive-tone electron-sensitive layer on the developer device 300 will be described in detail below, in which the energy received by the positive-tone electron-sensitive layer is irradiated from the electron-beam of the electron-beam device 200.

Figure 3:
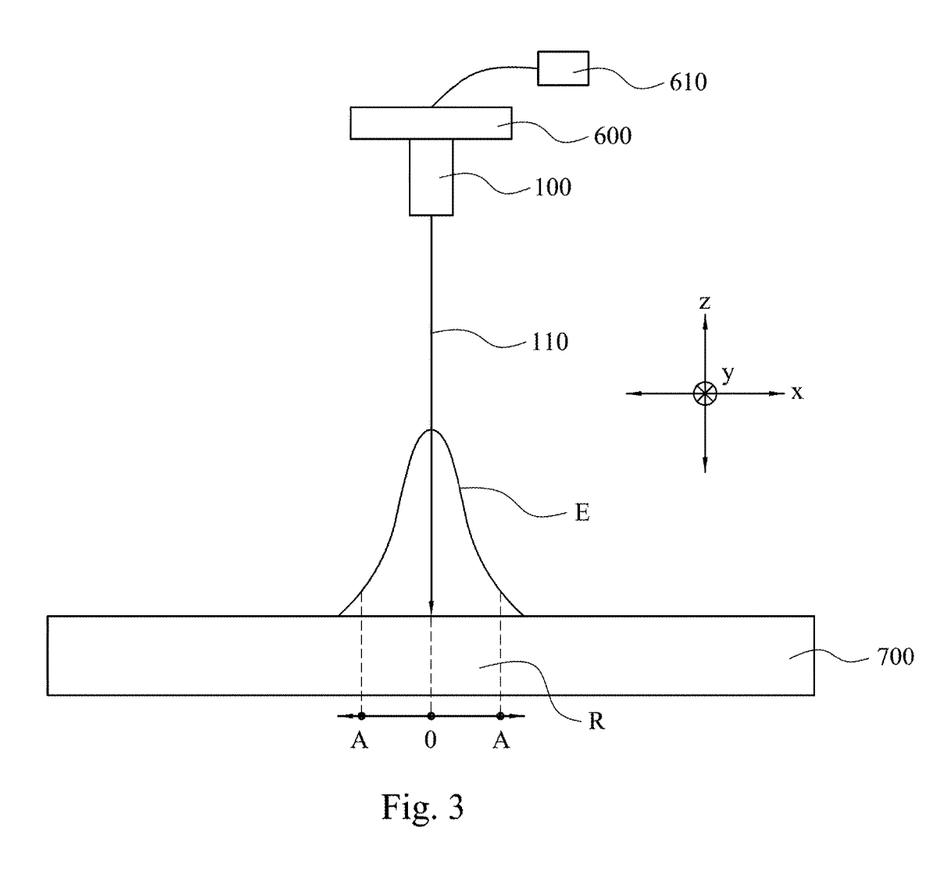
FIG. 3 is a schematic diagram of an energy distribution of an electron-beam irradiating a positive-tone electron-sensitive layer in accordance with some embodiments of the present disclosure.

Reference is made to FIG. 3. FIG. 3 is a schematic diagram of an energy distribution of an electron-beam irradiating a positive-tone electron-sensitive layer in accordance with some embodiments of the present disclosure. In some embodiments, the electron-beam 100 may emit an electron-beam 110 to irradiate a local area R of the positive-tone electron-sensitive layer 700 (that is, the first portion 710 of FIG. 2). A movement path of the electron beam 110 is controlled to define the exposure pattern by the electron-beam device 100. For example, as shown in FIG. 3, the electron-beam device 100 may be disposed on a movable carrier 600, and the electron-beam device 100 may move along with the movable carrier 600. A movement path of the movable carrier 600 is controlled by an actuator 610 that may store information of plural predetermined paths, in which the predetermined paths correspond to the predetermined exposure patterns. By using such a configuration, the electron-beam device 100 may be moved along the predetermined paths, so as to form the predetermined exposure pattern on the positive-tone electron-sensitive layer. Furthermore, an intensity of energy E of the electron-beam 110 at the local area R varies with positions of the local area R, in which the local area R absorbs the energy E from the electron-beam 110. A distribution of the intensity of energy E of the electron-beam 110 at the local area R with respect to the spatial positions at the local area R may be treated to fit a two dimensional Gaussian function. More particularly, as shown in FIG. 3, when the electron-beam 110 irradiates the local area of the positive-tone electron-sensitive layer 700, a center of the irradiation region of the electron-beam 110 serves as a central origin O of the local area R. The energy E of the electron-beam 110 at the central origin O of the local area R may be maximum, and the position (such as a point A of the local area R in the local area located father away from the central origin O of the local area has less energy E of the electron-beam 110. In other words, the energy E of the electron-beam 110 at a specific position in the local area R may be smaller when the specific position is located farther away from the central origin O in a X-direction or Y-direction as shown in FIG. 3. In other words, the energy E of the electron-beam 110 at the specific position in the local area R may be decreasing from the central region (such as the origin O) to the peripheral region (such as the point A). As a result, when the local area R of the positive-tone electron-sensitive layer 700 is performed by the development process, the development rate at the local area may be decreasing from the central region (such as the origin O) to the peripheral region (such as the point A), which will be discussed below.

Figure 4:
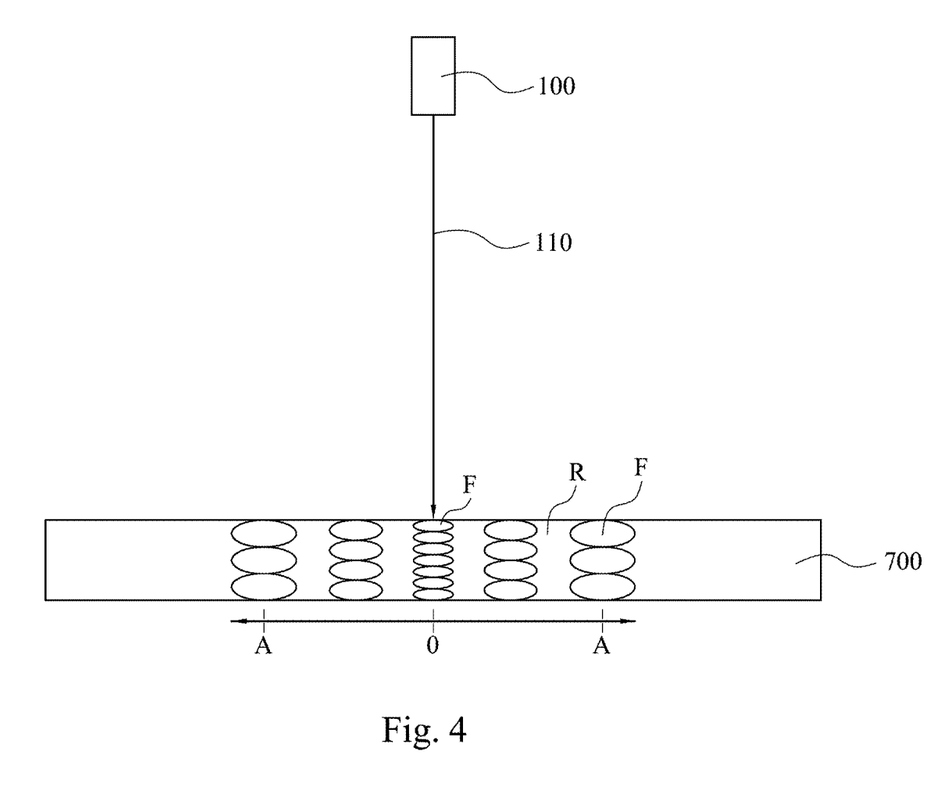
FIG. 4 is a schematic diagram of fragments of the positive-tone electron-sensitive layer of FIG. 3 formed while receiving the energy of the electron-beam.

Reference is made to FIG. 4. FIG. 4 is a schematic diagram of fragments of the positive-tone electron-sensitive layer of FIG. 3 formed while receiving the energy of the electron-beam. In some embodiments, when the electron-beam 110 irradiates the local area R of the positive-tone electron-sensitive layer, the electron-beam 110 may provide the energy E to the local area R so as to break bonds of the local area R, such that the local area R of the positive-ton electron-sensitive layer may form plural fragments F on the positive-ton electron-sensitive layer as shown in FIG. 4. It is noted that, since the electron-beam 110 may provide different energy intensities to different positions in the local area R, the fragments formed at the different positions in the local area R may have different molecular weights. More particularly, since the central region of the local area R (such as the origin O) may receive greater energy than the peripheral region of the local area R, the fragments F formed in the central region of the local area R of the positive-tone electron-sensitive layer 700 may have smaller molecular weights. That is, each fragment F in the central region may have fewer bonds than the peripheral region has, such that the central region of the local area R of the positive-tone electron-sensitive layer 700 may have the faster development rate. On the contrary, since the peripheral region of the local area R (such as the point A) may receive less energy than the central region does, the fragments F formed in the peripheral region of the local area R of the positive-tone electron-sensitive layer 700 may have greater molecular weights. That is, each fragment F in the peripheral region may have more bonds than that of the central region, such that the peripheral region of the local area R of the positive-tone electron-sensitive layer 700 may have a slower development rate. Therefore, when the local area R of the positive-tone electron-sensitive layer 700 is performed by the development process, the local area R at different positions may have different development rates, and the development rates may be decreasing from the central region to the peripheral region.

In some embodiments, as shown in FIG. 1 and FIG. 2, the electron-beam lithography system 10 may further include a pattern dimension simulation system 500. The pattern dimension simulation system 500 includes a computer configured to compute and output a development time T1 of the positive-tone electron-sensitive layer. In other words, the pattern dimension simulation system 500 may compute and output the development time T1 of the central part 712 of the first portion 710 of the positive-tone electron-sensitive layer 700. When a time for the developer device 200 developing the positive-tone electron-sensitive layer 700 is smaller than or equal to the development time T1, the developer device 200 may not develop the peripheral portion 714 of the positive-tone electron-sensitive layer 700. As a result, the electron beam lithography system 10 may control the exposure region (that is, the first portion 710) to be different from the development region (that is, the central part 714 of the first portion 710), such that the area of the development region of the positive-tone electron-sensitive layer 700 is smaller than that of the exposure region of the positive-tone electron-sensitive layer 700, thus advantageously enabling the size of the development pattern of the positive-tone electron-sensitive layer to be controlled more accurately.

More particularly, in some embodiments, the pattern dimension simulation system 500 has a mathematical model based on the aforementioned relationship between the distribution of energy intensity and the development rates, so as to compute the development time T1. Further, in some embodiments, the pattern dimension simulation system 500 may have a development rate database 510 and a development time determinator 520. The development rate database 510 may store plural development rates at different conditions, such as the development rates during different periods of development time, the development rates at different temperatures, or the development rates at different positions in the exposure region of the positive-tone electron-sensitive layer, or the development rates at other suitable conditions, but embodiments of the disclosure are not limited thereto. The development time determinator 520 is communicatively coupled to the development rate database 510. Therefore, when a user inputs the size value of the predetermined pattern into the pattern dimension simulation system 500, the development time determinator 520 may output the development time T1 based on the data stored by the development rate database 510 and the mathematical model.

More particularly, in some embodiments, the developer device 200 may further include a development time transmission/reception device 210 and an actuator 220. The development time transmission/reception device 210 is communicatively or electrically coupled to the actuator 220 and the development time determinator 520 and configured to receive a signal of the development time T1 outputted from the development time determinator 520. When the development time transmission/reception device 210 receives the signal of the development time T1, the development time transmission/reception device 210 may output a signal corresponding to the development time T1 to the actuator 220, such that the actuator 220 may drive the developer device 200 based on the development time T1. For example, when the development time T1 outputted from the development time determinator 520 and received by the development time transmission/reception device 210 is 30 seconds, the development time transmission/reception device 210 may output a signal to the actuator 220, and the actuator 220 may drive the developer device 200 to stop developing the positive-tone electron-sensitive layer after 30 seconds.

In some embodiments, the pattern dimension simulation system 500 determines the development time T1 based on a material of the positive-tone electron-sensitive layer. More particularly, the pattern dimension simulation system 500 may have a material database 530. The material database 530 may store plural material parameters, and the material parameters are obtained by a lot of experiments, and relate to the development rate in the development process. For example, the material parameter may be, but is not limited to, mobilities regarding different materials of the positive-tone electron-sensitive layer, diffusion rates regarding different materials of the positive-tone electron-sensitive layer, or other suitable material parameters. In other words, when the size of the predetermined pattern is inputted into the pattern dimension simulation system 500, the development time determinator 520 is communicatively coupled to the development rate database 510 and the material database 530. Then, the pattern dimension simulation system 500 may consider the relationship between the distribution of energy intensity and the development rates from an electron-beam parameter database 540, and considerate the development rate relation between the material of the positive-tone electron-sensitive and the material of the developer solution from the material database 530, so as to compute the development time T1. More particularly, the development time determinator 520 may have a transmission/reception device (not shown in the figure), and the development rate database 510 and the material database 530 may have a transmission/reception device (not shown in the figure) corresponding to the development time determinator 520. The transmission/reception device of the development time determinator 520 is communicatively or electrically coupled to the development rate database 510 and the material database 530, and configured to receive a signal from the development rate database 510 and the material database 530, which may benefit to assist the development time determinator 520 in computing the development time T1. In some embodiments, for example, the transmission/reception device of the development time determinator 520 may be, but is not limited to be, a wireless reception module or a wired reception module. The transmission/reception device of the development rate database 510 and the material database 530 may be, but is not limited to be, a wireless transmission module or a wired transmission module.

In some embodiments, the pattern dimension simulation system 500 is configured to compute and output a parameter recipe of the electron-beam device 100 depending on the size value of the predetermined pattern to be formed in the positive-tone electron-sensitive layer. More particularly, the pattern dimension simulation system 500 may have an electron-beam parameter database 540 and an electron-beam parameter determinator 550. The electron-beam parameter database 540 may store development rates in conditions of a plurality electron-beam parameters, such as the development rate in a condition of different voltages of the electron-beam, the development rate in a condition of different currents of the electron-beam, development rates in a condition of different doses of the electron-beam, developments rates in a condition of different spot sizes of the electron-beam, or development rates in other suitable conditions of the electron-beam, but it is not limited thereto. The electron-beam parameter determinator 550 is communicatively coupled to the electron-beam parameter database 540, therefore, when a user input the size value of the predetermined pattern into the pattern dimension simulation system 500, the electron-beam parameter determinator 550 may output the parameter recipe of the electron-beam device 100, such as the voltage, current, or dose of the electron-beam, based on the data stored by the electron-beam parameter database 540 and the mathematical model.

In some embodiments, for example, the parameter recipe of the electron-beam at least includes a high-current parameter, and the high-current parameter is between about 30 pA and about 300 pA. More particularly, the pattern dimension simulation system 500 of the present disclosure is based on the above mathematical model which is related to the two dimensional Gaussian function of the energy distribution of the electron-beam with respect to the spatial positions. In other words, when the electron-beam irradiates the local area R of the positive-tone electron-sensitive layer 700, values of current density received by the local area R along a thickness direction (such as Z direction) may be substantially equal, so as to improve a depth of field of the electron-beam in the positive-tone electron-sensitive layer 700, such that the depth of field of the electron-beam in the positive-tone electron-sensitive layer 700 may be greater than 150 nm. That is, when the thickness of the positive-tone electron-sensitive layer 700 is greater than 150 nm, the positive-tone electron-sensitive layer 700 at different depths may still receive uniform energy of the electron-beam. However, based on an electromagnetic theory of Maxwell, when the current of the electron-beam is unduly small, the energy distribution of the electron-beam with respect to the spatial positions cannot fit a two dimensional Gaussian function.

Furthermore, when the current of the electron-beam is unduly large, the electron-beam device 200 may not be under normal operation. Accordingly, when the high-current parameter of the electron is between about 30 pA and about 300 pA (for example, the current is between 30 pA and 70 pA, between 70 pA and 130 pA, between 130 pA and 230 pA, or between 230 pA and 300 pA), the pattern dimension simulation system 500 may be based on the mathematical model of two dimensional Gaussian function more accurately, so as to output the development time T1 and the parameter recipe of the electron-beam more accurately. It is noted that electron devices with different brands and types may have different high-current parameters, as long as the energy distribution of the electron-bean at such high-current parameter can fit a two dimensional Gaussian function, and the electron-beam device can be under normal operation, but the current value of the high-current parameter is not limited.

More particularly, in some embodiments, the electron-beam device 100 may include an electron-beam parameter transmission/reception device 120 and an electron-beam parameter adjustment device 130. The electron-beam parameter transmission/reception device 120 is communicatively or electrically coupled to the electron-beam parameter adjustment device 130 and electron-beam parameter determinator 550, and the electron-beam parameter transmission/reception device 120 is configured to receive the parameter recipe provided by the electron-beam parameter determinator 550. After the electron-beam parameter transmission/reception device 120 receives the parameter recipe, the electron-beam parameter transmission/reception device 120 may transmit a signal to the electron-beam parameter adjustment device 130 based on the parameter recipe, such that the electron-beam parameter adjustment device 130 may adjust the parameter of the electron-beam device 100 based on the parameter recipe. For example, when the electron-beam parameter transmission/reception device 120 receives the parameter recipe with a current of 100 pA, a voltage of the 100 keV and a dose of 10 fC, which is provided by the electron-beam parameter determinator 550, the electron-beam parameter transmission/reception device 120 may transmit a signal to the electron-beam parameter adjustment device 130, such that the electron-beam parameter adjustment device 130 may make the electron device 100 emit an electron-beam with a current of 100 pA, a voltage of the 100 keV and a dose of 10 fC, but it is not limited thereto.

In some embodiments, the pattern dimension simulation system 500 includes a mathematical mode. The mathematical model is based on a relation between the energy distribution of the electron-beam and the development rate, and the mathematical model is fitted a scattering distribution of electron and the theory of molecular dynamics in the development process and to be simplified as a following equation:

$$r \approx \sqrt{(2\sigma_r^2 \ln(\alpha t + 1)}$$ equation (I)

, in which "r" represents the size value of the predetermined development pattern, "$\sigma_r$" represents a coefficient about the parameter of the electron-beam, "$\alpha$" represents a coefficient about the material of the positive-tone electron-sensitive layer or about the material of the developer solution, and "t" represents the development time. As a result, by the mathematical model of the pattern dimension simulation system 500, the pattern dimension simulation system 500 may compute and output the development time T1 more accurately, depending on the size value of the predetermined pattern to be formed in the positive-tone electron-sensitive layer. More particularly, by the above equation (I), the pattern dimension simulation system 500 may compute the development rates at different positions of the local area R of the positive-tone electron-sensitive layer, which is irradiated by the electron-beam. The development rate in the local area R is proportional to the energy of the electron-beam irradiated in the local area R, and the development rate is inversely proportional to the temperature of the developer solution.

Figure 5:
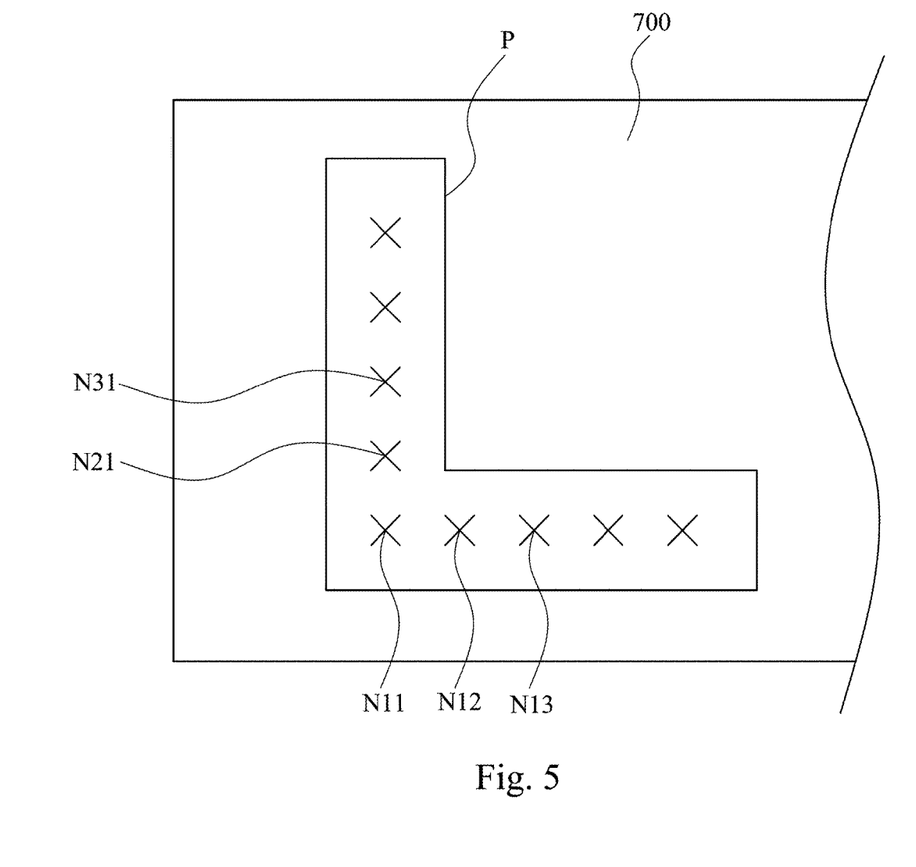
FIG. 5 is a schematic diagram of a predetermined pattern to be formed in the positive-tone electron-sensitive layer.

Reference is made to FIG. 5. FIG. 5 is a schematic diagram of a predetermined pattern to be formed in the positive-tone electron-sensitive layer. In some embodiments, for example, the electron-beam may uniformly irradiate the positive-tone electron-sensitive layer 700 with a fixed energy in accordance with the predetermined pattern to be formed therein, and a central point of the electron spot of the electron beam in the positive-tone electron-sensitive layer 700 may be represented as a node, such as node N11, N12, or N13 as shown in FIG. 5, in which the adjacent two nodes are separated from each other by a distance. By calculating a development rate of the developer solution for outwardly developing the positive-tone electron-sensitive layer 700 from the node, the pattern dimension simulation system 500 may obtain a time for developing a specific distance of the positive-tone electron-sensitive layer 700 from the node. For example, a time for developing the positive-tone electron-sensitive layer 700 outwardly from the node N12 to the node N21 may be a first development time T1, a time for outwardly developing the positive-tone electron-sensitive layer 700 from the node N12 to the node N13 and N31 may be a second development time T2. In other words, when the energy of the electron-beam irradiating at each node is fixed, the time for the developer solution to outwardly develop the positive-tone electron-sensitive layer 700 from the node (such as the node N11, N12, N21 or N31) to a peripheral P may be different. However, when the time for the developer solution to outwardly develop the positive-tone electron-sensitive layer 700 from the node to a peripheral P is different, the development pattern of the positive-tone electron-sensitive layer 700 may be easily distorted. Therefore, the present disclosure may utilize the pattern dimension simulation system 500 to output the parameter recipe of the electron-beam, so as to control the development pattern of the positive-tone electron-sensitive layer 700 developed by the developer solution to be as same as the predetermined development pattern.

More particularly, in some embodiments, the pattern dimension simulation system 500 is based on a graph theory to compute and obtain a shortest path of the developer solution developing the peripheral P of the predetermined pattern in a structural relation between points or lines. State differently, the pattern dimension simulation system 500 computes and obtains a critical development time for the developer solution to develop the positive-tone electron-sensitive layer 700 from the node to the peripheral P of the predetermined pattern. When the actual development time is equal to the critical development time, the size of the actual development pattern of the positive-tone electron-sensitive layer 700 may be equal to that of the predetermined development pattern. In other words, the pattern dimension simulation system 500 may compute and output the expected energy of the electron-beam at different nodes N, and then the electron-beam parameter adjustment device 130 may adjust the parameters of the electron-beam of the electron-beam device 100, so as to vary the development rates of the developer solution to outwardly develop the positive-tone electron-sensitive layer 700 from different nodes, such that the developer solution may develop the positive-tone electron-sensitive layer 700 from the node (such as the node N11, N12, N21, or N31) to the peripheral P of the predetermined pattern with the same development time, such that the size of the development pattern may be controlled more accurately. In other words, by computing and adjusting the energy of the electron-beam at different points, the pattern dimension simulation system 500 may obtain the development time T1, such that the critical development time for the developer solution to develop he node to the peripheral P of the predetermined pattern may be equal to the development time T1.

In some embodiments, for example, the pattern dimension simulation system 500 is based on an algorithm of computer science to compute and output the expected energy of the electron-beam at different nodes N when the developer solution develops the positive-tone electron-sensitive layer 700 from each node to the peripheral P of the predetermined pattern with the same development time. For example, the energy of the electron-beam at the node N12 is less than that of the node N13, or the energy of the electron-beam at the node N12 is greater than that of the node N31, but it is not limited thereto. More particularly, the pattern dimension simulation system 500 may examine the energy of the electron-beam at each node N several times for optimizing a standard deviation between the critical development times from each of the nodes N to the peripheral P of the predetermined pattern, such that the critical development times from each of the nodes N to the peripheral P of the predetermined pattern may be equal. In addition, the algorithm of computer science utilized in the pattern dimension simulation system 500 may be, but is not limited to be, an exhaustive search (that is, a brute-force search) or a particle swarm optimization search.

In some embodiments, for example, the pattern dimension simulation system 500 is based on an algorithm of the particle swarm optimization search to compute the expected energy of the electron-beam at each node. More particularly, the particle swarm optimization search includes following steps. Input an initial energy of the electron-beam at each node N. Compute a standard deviation of the critical development times from each node N. Compute and output a performance index of the critical development time by a fitness evaluation. Cyclically examine the energy of the electron-beam at each node N depending on the performance index until obtaining an optimum of the standard deviation of the critical development times. In other words, during a process of the particle swarm optimization search, the pattern dimension simulation system 500 has a feedback function and a memorized function for computing the expected energy of the electron-beam at each node, so the particle swarm optimization search may assist the standard deviation of the critical development times in converging into the optimum quickly, but it is not limited thereto.

In general, depending on the size of the predetermined pattern to be formed in positive-tone electron-sensitive layer, the pattern dimension simulation system 500 may compute and output the development time T1, the parameter recipe of the electron-beam device 100, or any other suitable parameters. Accordingly, the electron-beam lithography system 10 may control the size of the development pattern of the positive-tone electron-sensitive layer more accurately, and the size of the development pattern of the positive-tone electron-sensitive layer formed by the electron-beam lithography system 10 of the present disclosure may range from about 4 nm to about 8 nm.

Further, the electron-beam lithography system 10 of the present disclosure may effectively utilize the proximity effect to adjust the size of the actual development pattern to be the same as that of the predetermined development pattern. More particularly, depending on the development rate database 510, the material database 530, and the electron-beam parameter database 540, the pattern dimension simulation system 500 may compute a crucial development time T2 of the positive-tone electron-sensitive layer which may be affected by the proximity effect, so as to adjust the size of the actual development pattern. In some embodiments, for example, the electron-beam 110 irradiates the positive-tone electron-sensitive layer with a plurality of discrete electron spots, and a plurality of discrete local areas R1 irradiated by the electron spots are formed in the positive-tone electron-sensitive layer. Afterwards, the actual development pattern may be formed by the development process. However, due to the proximity effect of the electron-beam, peripherals of any adjacent two of the local areas R1 may have overlapping exposure energy. Therefore, when the development time T1 is greater than the crucial development time T2, a gap between the peripherals of any adjacent two of the local areas R1 may also be developed, such that the actual development pattern may be a continuous linear pattern. Alternatively, when the development time T1 is less than the crucial development time T2, the gap between the peripherals of any adjacent two of the local areas R1 may not be developed, such that the actual development pattern may be the discrete local areas R1. In other words, by such crucial development time T2 computed by the pattern dimension simulation system 500, the electron-beam lithography system 10 may effectively control the proximity effect of the electron-beam in the positive-tone electron-sensitive layer, so as to adjust the size of the actual development pattern.

Figure 6:
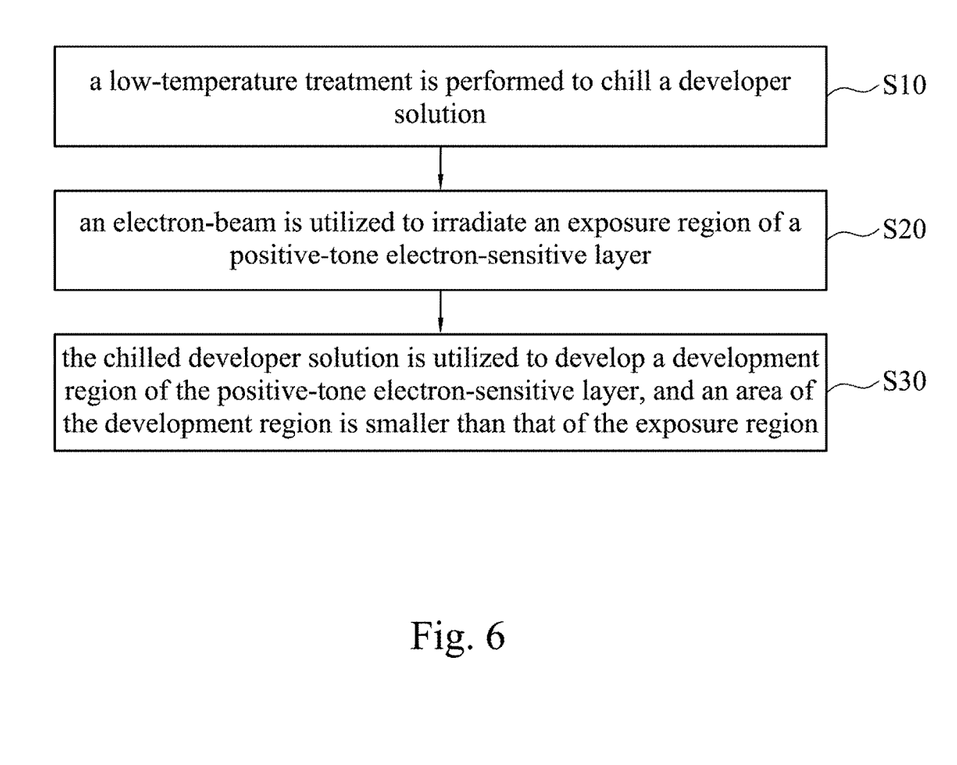
FIG. 6 is a flow chart showing an electron-beam lithography method in accordance with some embodiments of the present disclosure.

Reference is made to FIG. 6. FIG. 6 is a process flow of an electron-beam lithography method in accordance with some embodiments of the present disclosure. In some embodiments, the electron-beam lithography method includes following steps. In step S10, a low-temperature treatment is performed to chill a developer solution. In step S20, an electron-beam is utilized to irradiate a first portion (that is, an exposure region) of the positive-tone electron-sensitive layer 700, and the first portion 710 of the positive-tone electron-sensitive layer 700 has a central part 712 and a peripheral part 714 around the central part 712. In step S30, the chilled developer solution is utilized to develop the central part 712 of the first portion of the positive-tone electron-sensitive layer 700 (that is, the development region), and an area of the central part 712 is smaller than that of the first portion 710. In other words, the positive-tone electron-sensitive layer exposed by the electron-beam is immersed in the chilled developer solution, and then a development pattern is formed in the positive-tone electron-sensitive layer.

More particularly, in some embodiments, the positive-tone electron-sensitive layer may be coated on a substrate. For example, the substrate may be a semiconductor substrate, such as a silicon substrate, a germanium substrate, or any other suitable material. Alternatively, the substrate may be, but is not limited to be, a dielectric substrate, such as sapphire, or any other suitable material. In some embodiments, the positive-tone electron-sensitive layer may be, but is not limited to be, a positive-tone electron-sensitive resist, such as ZEP520A, ZEP7000, PMMA, SML, P(MMA-MMA) or other suitable material. In some embodiments, the developer solution may be, but is not limited to be, ZED-N50, ZMD-C, or other suitable material.

In some embodiments, for example, the positive-tone electron-sensitive layer may be ZEP520A which is spin coated onto a silicon substrate with 3000~4000 rotations per minute, and then the positive-tone electron-sensitive layer may have a thickness of about 150 nm to 300 nm. Afterwards, the electron-device 100 may emit the electron-beam 110 into the positive-tone electron-sensitive layer, and the electron-beam may expose the positive-tone electron-sensitive layer with a voltage of about 90 keV to about 120 keV, and a dose of about 3 fC to about 12 fC or a parameter of other suitable conditions. Then, the exposed positive-tone electron-sensitive layer may be immersed into the developer solution of ZED-N50, in which the temperature of the developer solution ranges from about 25° C. to 40° C. Afterwards, the positive-tone electron-sensitive layer is developed in about 1 second to about 50 seconds, and the resulting development pattern may be formed in the positive-tone electron-sensitive layer. As a result, the size of the development pattern of the positive-tone electron-sensitive layer formed by the above electron-beam lithography method may range from about 4 nm to about 8 nm, and a line with height aspect ratio may be about 15:1 to about 30:1, but it is not limited thereto.

In some embodiments, the electron-beam lithography method includes inputting the size value of the predetermined pattern to be formed in the positive-tone electron-sensitive layer into the pattern dimension simulation system 500, computing and outputting the development time T1 of the development region of the positive-tone electron-sensitive layer by the pattern dimension simulation system 500. Further, the pattern dimension simulation system 500 determines the development time T1 depending on a material of the positive-tone electron-sensitive layer. In some embodiments, for example, when the size value of the predetermined pattern is 6 nm, an user may select the predetermined pattern of 6 nm in the pattern dimension simulation system 500, and select the material of the positive-tone electron-sensitive layer, the material of the developer solution, the temperature of the developer solution and/or the parameter recipe of the electron-beam device 100, and then the pattern dimension simulation system 500 may output the development time T1 depending on the operation of the development rate database 510, the material database 530, the electron-beam parameter database 540 and the development time determinator 520.

In some embodiments, the electron-beam lithography method includes inputting a size value of the predetermined pattern to be formed in the positive-tone electron-sensitive layer into the pattern dimension simulation system 500, computing and outputting the parameter recipe of the electron-beam to irradiate the positive-tone electron-sensitive layer by the pattern dimension simulation system 500. In some embodiments, for example, when the size value of the predetermined pattern is 6 nm, an user may select the predetermined pattern of 6 nm in the pattern dimension simulation system 500, and select the material of the positive-tone electron-sensitive layer, the material of the developer solution, the temperature of the developer solution and/or the development time T1, and then the pattern dimension simulation system 500 may output the parameter recipe of the electron-beam, such as a voltage of the electron-beam, a current of the electron-beam, a dose of the electron-beam, or other suitable parameters, depending on the operation of the development rate database 510, the material database 530, the electron-beam parameter database 540 and the development time determinator 520, but it is not limited thereto.

In accordance with some embodiments of the present disclosure, by such configuration of the cooling device and the controller, the electron-beam lithography system may reduce the temperature of the developer solution, so as to control a dissolution rate of the developer solution for dissolving the positive-tone electron-sensitive layer, benefiting to accurately control the size of the development pattern formed in the positive-tone electron-sensitive layer, and also to effectively reduce a minimum size of the development pattern formed in the positive-tone electron-sensitive layer.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electron-beam lithography method, comprising:
   performing a low-temperature treatment to chill a developer solution;
   utilizing an electron-beam to irradiate an exposure region of a positive-tone electron-sensitive layer; and
   utilizing the chilled developer solution to develop a development region of the positive-tone electron-sensitive layer, wherein the development region is present within the exposure region, and an area of the development region is smaller than an area of the exposure region;
   inputting a size value of a predetermined pattern to be formed in the positive-tone electron-sensitive layer into a pattern dimension simulation system; and
   computing and outputting a parameter recipe of the electron-beam used to irradiate the positive-tone electron-sensitive layer by the pattern dimension simulation system, wherein the parameter recipe of the electron-beam includes a high current parameter, and the high current parameter is substantially in a range between 30 pA to 300 pA, such that the pattern dimension simulation system is based on a model of two dimensional Gaussian function.

2. The electron-beam lithography method of claim 1, further comprising:
   inputting a size value of a predetermined pattern to be formed in the positive-tone electron-sensitive layer into the pattern dimension simulation system; and
   computing and outputting a development time of the development region of the positive-tone electron-sensitive layer by the pattern dimension simulation system.

3. The electron-beam lithography method of claim 2, wherein the pattern dimension simulation system determines the development time based on a material of the positive-tone electron-sensitive layer.

4. The electron-beam lithography method of claim 1, wherein the parameter recipe of the electron-beam includes a voltage value, a current value, a beam size or combinations thereof.

5. The electron-beam lithography method of claim 1, wherein the chilled developer solution has a temperature substantially in a range from about −25° C. to about 40° C.

6. An electron-beam lithography system, comprising:
   an electron-beam device configured to irradiate an exposure region of a positive-tone electron-sensitive layer;
   a chemical tank configured to accommodate a developer solution, wherein the developer solution is used to develop a development region of the positive-tone electron-sensitive layer irradiated by the electron-beam device, the development region is present within the exposure region, and an area of the development region is smaller than an area of the exposure region;
   a cooling device mounted in the chemical tank, wherein the cooling device is configured to chill the developer solution before the chemical tank develops the positive-tone electron-sensitive layer; and
   a pattern dimension simulation system having a computer configured to compute and output a development time of the positive-tone electron-sensitive layer based on a size value of a predetermined pattern to be formed in the positive-tone electron-sensitive layer, wherein
   the electron-beam device adjusts a parameter recipe of the electron-beam device depending on the pattern dimension simulation system, and the parameter recipe comprises a voltage value, a current value, a beam size or combinations thereof, wherein the electron-beam device is configured to adjust a current parameter in a range between 30 pA to 300 pA, such that the pattern dimension simulation system is based on a model of two dimensional Gaussian function.

7. The electron-beam lithography system of claim 6, wherein the cooling device is configured to chill the developer solution at a temperature ranging from about −25° C. to about 40° C.

8. The electron-beam lithography system of claim 6, wherein the pattern dimension simulation system determines the development time based on a material of the positive-tone electron-sensitive layer.

9. The electron-beam lithography system of claim 6, wherein the pattern dimension simulation system determines the development time based on a parameter recipe of the electron-beam device of the electron-beam device.

* * * * *